United States Patent [19]

Ura

[11] 4,007,352
[45] Feb. 8, 1976

[54] THIN FILM THERMAL PRINT HEAD
[75] Inventor: Frank Ura, Palo Alto, Calif.
[73] Assignee: Hewlett-Packard Company, Palo Alto, Calif.
[22] Filed: July 31, 1975
[21] Appl. No.: 601,115
[52] U.S. Cl. .................................. 219/216; 29/611; 219/543; 338/308; 346/76 R; 427/126
[51] Int. Cl.² ............................................ H05B 1/00
[58] Field of Search ......... 219/216, 543; 346/76 R; 427/123, 126, 103; 29/611; 156/8; 338/306–308, 314

[56] References Cited
UNITED STATES PATENTS

| | | | |
|---|---|---|---|
| 3,483,356 | 12/1969 | Kalt | 346/76 R X |
| 3,495,070 | 2/1970 | Zissen | 219/216 |
| 3,904,461 | 9/1975 | Ester et al. | 338/308 X |

Primary Examiner—C. L. Albritton
Attorney, Agent, or Firm—F. D. LaRiviere

[57] ABSTRACT

After the mesas are formed in the glass glaze over an aluminum oxide substrate by etching, and before resistive and conductive materials are deposited over the mesas by thin film techniques, an aluminum oxide underlayer is applied. The aluminum oxide underlayer provides controlled etching of the raised heater elements and conductors to prevent undesirable additional erosion of the glass glaze mesas.

4 Claims, 3 Drawing Figures

WITH ALUMINUM OXIDE UNDERLAYER

WITHOUT ALUMINUM OXIDE UNDERLAYER

WITH ALUMINUM OXIDE UNDERLAYER

THIN FILM THERMAL PRINT HEAD

BACKGROUND & SUMMARY OF THE INVENTION

The chemical used for etching of the resistive film to form individual resistors in a thin film thermal print head is extremely hard to control, particularly after it has etched through the resistive film. Such a process is referred to in allowed U.S. Patent Application Ser. No. 524,108 entitled "Thin Film Thermal Print Head", filed on Nov. 15, 1974 by Frank Ura. In that process, etching continues into the glass glaze, actually eroding the mesa beneath portions of the resistor. Since those portions of the resistor are left unsupported they tend to crack or break off even with addition of a wear layer material at the end of the fabrication process. The overall reliability of the thermal print head is thereby substantially diminished.

To preclude etchant from attacking the glass glaze material, a layer of etchant-resistant material is applied to the entire area of glass glaze including the resistor mesas prior to depositing the resistive material. The etchant-resistant layer should be chemically inert to the etchant used, thus protecting the glass glaze from attack by the etchant.

DESCRIPTION OF THE PREFERRED EMBODIMENT

Figure 1:
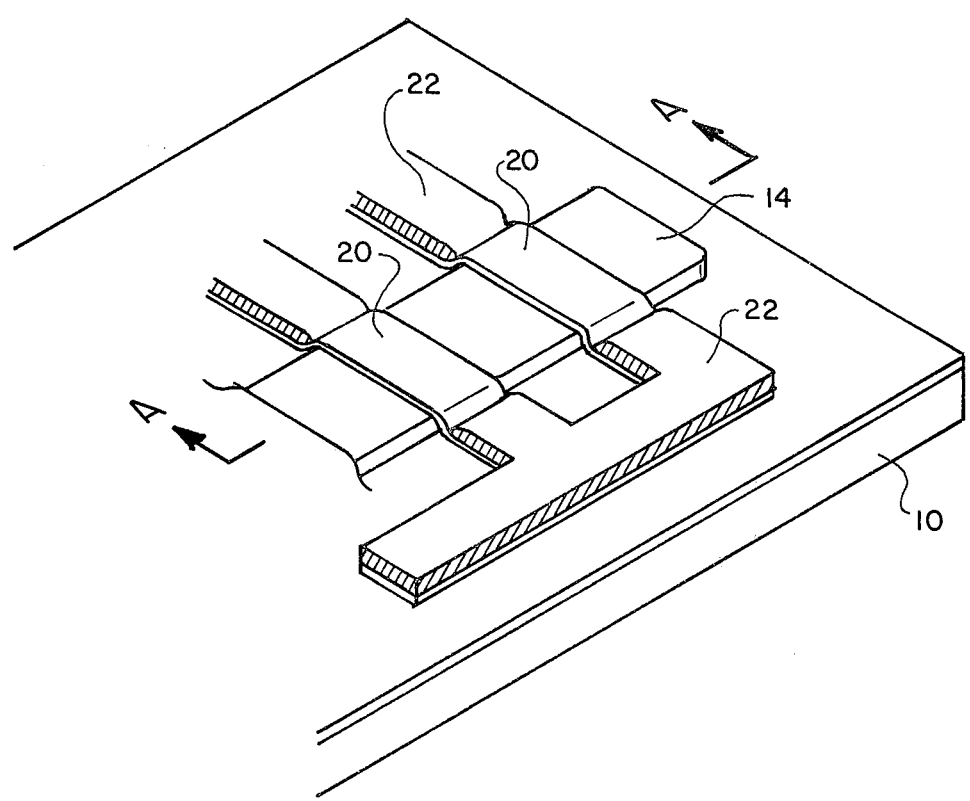
FIG. 1 is a perspective view of a portion of a thin film thermal print head.
Figure 2:
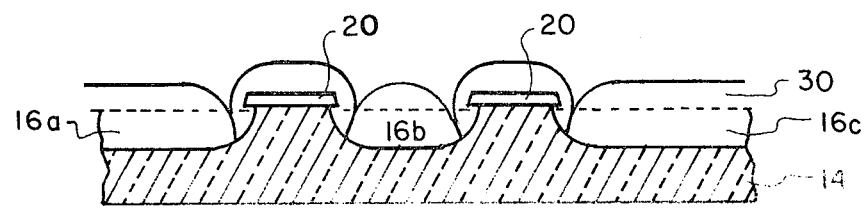
FIG. 2 is a cross-sectional view at section A—A of the print head of FIG. 1.

The present invention relates to thin film thermal print heads specifically of the type described in allowed U.S. Patent Application Ser. No. 524,108 entitled "Thin Film Thermal Print Head", filed Nov. 15, 1974 by Frank Ura, which is incorporated by reference as amended as if fully set forth herein. Referring to FIG. 1, resistor 20 is shown deposited on mesa 14 having conductors 22 applied connected to each end thereof. Referring now to FIG. 2, portions of glass mesa, 16a, 16b and 16c have been etched by the etchant used to form resistors 20 in accordance with the pattern of photoresist material applied. In those areas of portions 16a, 16b and 16c immediately adjacent resistors 20 the glass glaze mesa has been eroded beneath resistors 20, thus leaving them vulnerable to cracking and breaking off since they are no longer supported by glass glaze. Addition of aluminum oxide wear layer 30 usually fails to provide the necessary structural support to preserve the integrity of the resistors structure since the wear layer material frequently fails to fill in the eroded portions of the glass mesa 14 directly beneath the chemically delineated resistors 20.

The etchant used for etching of the resistive film is a mixture of hydrofloric acid (Hf), nitric acid ($HNO_3$) and water. This etchant is selected as effective for etching the resistive material which may be tantalum nitride, tantalum/aluminum or some equivalent resistive material. Very few other chemical etchants are effective for etching these resistive materials without also attacking the photoresist material used to define the individual resistors.

Figure 3:
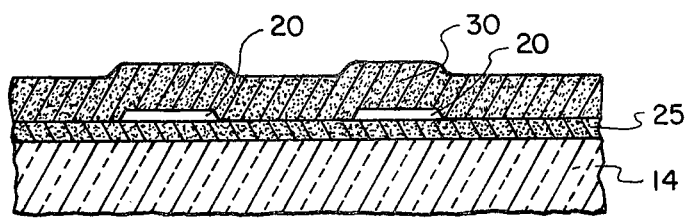
FIG. 3 is a cross-sectional view at section A—A of the print head of FIG. 1 including the etchant-resistant underlayer according to the preferred embodiment of the present invention.

Referring now to FIG. 3, etchant-resistant layer 25 is applied over the glass glaze layer including the mesas for insulating them from chemical attack by the etchant after resistors 20 have been formed. The etchant-resistant material is aluminum oxide and is applied over the entire surface of the print head prior to depositing the resistive material and photoresist material for forming resistors 20. Thus the etchant forms resistors 20 without further eroding mesa 14 or other portions of the glass glaze layer of which mesa 14 and other mesas are formed.

As noted above, wear layer 30 is also aluminum oxide material. While other wear layer materials can be used for wear layer 30, for the preferred embodiment of this invention the same processing techniques and equipment can be used to apply both etchant-resistant layer 25 and wear layer 30. In addition, in the regions between resistors 20, wear layer 30 is contiguous with etchant-resistant layer 25, and being of the same material, may actually provide a better chemical bond therebetween thus enhancing the overall reliability of the print head.

I claim:
1. A thin film thermal print head comprising:
   an aluminum oxide substrate;
   a layer of glass glaze covering the substrate having a plurality of mesas formed on the surface thereof;
   a layer of etchant-resistant material covering the layer of glass glaze including the plurality of mesas and having a high chemical resistance to photoresist materials;
   a layer of resistive material covering the etchant-resistant material in the area of the mesas to form resistive heater elements thereon;
   a plurality of electrical conductors coupled to the heater elements for connecting electrical power thereto;
   a layer of oxide of the resistive material covering each of heater elements; and
   a layer of wear-resistant material covering the layer of oxide and having a relatively high thermal conductivity.
2. A thin film thermal print head as in claim 1 wherein the etchant-resistant material is aluminum oxide.
3. A thin film thermal print head as in claim 1 wherein the wear-resistant material is aluminum oxide.
4. A thin film thermal print head as in claim 1 wherein the etchant-resistant material and the wear-resistant material are aluminum oxide.

* * * * *